US009766511B2

(12) United States Patent
Yoo et al.

(10) Patent No.: US 9,766,511 B2
(45) Date of Patent: Sep. 19, 2017

(54) DISPLAY DEVICE

(71) Applicant: SAMSUNG DISPLAY CO., LTD., Yongin-si (KR)

(72) Inventors: Donghyun Yoo, Hwaseong-si (KR); Hyungjun Park, Seongnam-si (KR); Seongyoung Lee, Hwaseong-si (KR); Seonkyoon Mok, Hwaseong-si (KR); Kyungho Park, Asan-si (KR); Kyunghoe Lee, Seoul (KR); Kyeuk Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/995,590

(22) Filed: Jan. 14, 2016

(65) Prior Publication Data
US 2016/0334678 A1  Nov. 17, 2016

(30) Foreign Application Priority Data

May 11, 2015 (KR) .................. 10-2015-0065468

(51) Int. Cl.
| | | |
|---|---|---|
| *G02F 1/1343* | (2006.01) | |
| *G02F 1/1362* | (2006.01) | |
| *G02F 1/1335* | (2006.01) | |
| *H01L 27/12* | (2006.01) | |
| *H01L 29/786* | (2006.01) | |
| *G02F 1/1368* | (2006.01) | |

(52) U.S. Cl.
CPC .. *G02F 1/134309* (2013.01); *G02F 1/133514* (2013.01); *G02F 1/136209* (2013.01); *G02F 1/136227* (2013.01); *G02F 1/136286* (2013.01); *H01L 27/124* (2013.01); *H01L 29/78633* (2013.01); *G02F 1/1368* (2013.01); *G02F 2001/13629* (2013.01); *G02F 2001/136218* (2013.01); *G02F 2202/103* (2013.01)

(58) Field of Classification Search
CPC ... G02F 1/136209; G02F 2001/136218; G02F 1/136227; G02F 1/134309; H01L 27/124; H01L 29/78633
See application file for complete search history.

(56) References Cited

U.S. PATENT DOCUMENTS

| | | |
|---|---|---|
| 2003/0178628 A1 | 9/2003 | Aoki et al. |
| 2008/0099764 A1 | 5/2008 | Choi et al. |
| | (Continued) | |

FOREIGN PATENT DOCUMENTS

| | | |
|---|---|---|
| KR | 1020080037132 | 4/2008 |
| KR | 1020110041139 | 4/2011 |

OTHER PUBLICATIONS

Extended European Search Report for Application No. 16164388.7 mailed on Jun. 20, 2016, citing the above reference(s).

*Primary Examiner* — Dennis Y Kim
(74) *Attorney, Agent, or Firm* — Cantor Colburn LLP (57) ABSTRACT

A display device includes a substrate, a gate wiring on the substrate, the gate wiring including a gate line and a gate electrode, a data wiring which is disposed on the substrate and insulated from the gate wiring, the data wiring including a data line, a source electrode, and a drain electrode, a pixel electrode which is disposed on the substrate and insulated from the data wiring, the pixel electrode being connected to the drain electrode through a contact hole, and a backlight shielding electrode below the contact hole.

22 Claims, 9 Drawing Sheets

(56) References Cited

U.S. PATENT DOCUMENTS

| | | |
|---|---|---|
| 2011/0090417 A1 | 4/2011 | Kim et al. |
| 2013/0208206 A1 | 8/2013 | Park et al. |
| 2014/0028942 A1 | 1/2014 | Takeuchi et al. |
| 2014/0125908 A1* | 5/2014 | Hong ................ G02F 1/136209 349/44 |

* cited by examiner

DISPLAY DEVICE

This application claims priority to Korean Patent Application No. 10-2015-0065468, filed on May 11, 2015, and all the benefits accruing therefrom under 35 U.S.C. §119, the content of which in its entirety is incorporated herein by reference.

BACKGROUND

1. Field

Exemplary embodiments of the invention relate to a display device, and more particularly, to a display device enhanced in regard to display quality.

2. Description of the Related Art

Display devices are classified into types including liquid crystal display ("LCD") devices, organic light emitting diode ("OLED") display devices, plasma display panel ("PDP") devices, electrophoretic display ("EPD") devices, and the like, based on a light emitting scheme thereof.

Among such display devices, an active-matrix-type display device is widely used in which pixel areas are arranged in a matrix form, the pixel area being defined by a gate wiring and a data wiring intersecting each other, a switching element, such as a thin film transistor ("TFT"), and a pixel electrode are provided in each pixel area, and a data signal applied to each pixel area is controlled by the switching element.

In recent times, a process of forming a semiconductor pattern and a data wiring pattern using a single mask is being commercialized in order to reduce production costs. In this case, the data wiring pattern has a smaller width than that of the semiconductor pattern in a plan view due to isotropy of wet etching and an etch-back process. In other words, the semiconductor pattern has a protrusion which does not overlap the data wiring pattern in a plan view.

SUMMARY

In general, a semiconductor pattern includes amorphous silicon (a-Si), and amorphous silicon varies in conductivity based on an amount of incident light. Accordingly, a capacitance of a capacitor formed between the semiconductor pattern and the data wiring pattern is affected by whether the protrusion of the semiconductor pattern receives light emitted from a backlight unit. As a result, a waterfall phenomenon occurs in a display device in which bright band-shaped portions and dark band-shaped portions appear to flow down from the top to the bottom of the display device.

Exemplary embodiments of embodiments of the invention are directed to a display device which prevents a waterfall phenomenon.

According to an exemplary embodiment of the invention, a display device includes a substrate, a gate wiring on the substrate, the gate wiring including a gate line and a gate electrode, a data wiring disposed on the substrate to be insulated from the gate wiring, the data wiring including a data line, a source electrode, and a drain electrode, a pixel electrode disposed on the substrate to be insulated from the data wiring, the pixel electrode being connected to the drain electrode through a contact hole, and a backlight shielding electrode below the contact hole.

In an exemplary embodiment, the backlight shielding electrode may be disposed on a same layer on which the gate wiring is disposed.

In an exemplary embodiment, the backlight shielding electrode may be spaced apart from the gate wiring.

In an exemplary embodiment, the backlight shielding electrode may have an island shape.

In an exemplary embodiment, the backlight shielding electrode may have a circular or polygonal shape.

In an exemplary embodiment, the backlight shielding electrode may have an area greater than an overlapping area between the drain electrode and the pixel electrode.

In an exemplary embodiment, the drain electrode may include a first drain electrode having a portion overlapping the gate electrode, and a second drain electrode extending from the first drain electrode and having a polygonal shape.

In an exemplary embodiment, the backlight shielding electrode may have an area greater than an overlapping area between the second drain electrode and the pixel electrode.

In an exemplary embodiment, the pixel electrode may include a pixel electrode contact portion connected to the second drain electrode through the contact hole.

In an exemplary embodiment, the display device may further include a semiconductor layer disposed to overlap the data wiring.

In an exemplary embodiment, the semiconductor layer may directly contact the data wiring.

According to another exemplary embodiment of the invention, a display device includes a first substrate and a second substrate opposing each other, a liquid crystal ("LC") layer between the first substrate and the second substrate, a gate wiring on the first substrate, the gate wiring including a gate line and a gate electrode, a data wiring disposed on the first substrate to be insulated from the gate wiring, the data wiring including a data line, a source electrode, and a drain electrode, a pixel electrode disposed on the first substrate to be insulated from the data wiring, the pixel electrode being connected to the drain electrode through a contact hole, and a backlight shielding electrode below the contact hole.

In an exemplary embodiment, the backlight shielding electrode may be disposed on a same layer on which the gate wiring is disposed.

In an exemplary embodiment, the backlight shielding electrode may be spaced apart from the gate wiring.

In an exemplary embodiment, the backlight shielding electrode may have an island shape.

In an exemplary embodiment, the backlight shielding electrode may have a circular or polygonal shape.

In an exemplary embodiment, the backlight shielding electrode may have an area greater than an overlapping area between the drain electrode and the pixel electrode.

In an exemplary embodiment, the drain electrode may include a first drain electrode having a portion overlapping the gate electrode, and a second drain electrode extending from the first drain electrode and having a polygonal shape.

In an exemplary embodiment, the backlight shielding electrode may have an area greater than an overlapping area between the second drain electrode and the pixel electrode.

In an exemplary embodiment, the pixel electrode may include a transverse stem electrode, a longitudinal stem electrode, a plurality of branch electrodes extending from the transverse stem electrode and the longitudinal stem electrode, a connector extending from the longitudinal stem electrode, and a pixel electrode contact portion extending from the connector.

In an exemplary embodiment, the branch electrode may include a first branch electrode extending from the transverse stem electrode and the longitudinal stem electrode in an upper-left direction, a second branch electrode extending from the transverse stem electrode and the longitudinal stem electrode in an upper-right direction, a third branch electrode extending from the transverse stem electrode and the longitudinal stem electrode in a lower-left direction, and a fourth branch electrode extending from the transverse stem electrode and the longitudinal stem electrode in a lower-right direction.

In an exemplary embodiment, the display device may further include a color filter between the data wiring and the pixel electrode.

BRIEF DESCRIPTION OF THE DRAWINGS

The above and other features and exemplary embodiments of the invention of invention will be more clearly understood from the following detailed description taken in conjunction with the accompanying drawings, in which.

DETAILED DESCRIPTION

Exemplary embodiments will now be described more fully hereinafter with reference to the accompanying drawings.

Although the invention can be modified in various manners and have several embodiments, specific embodiments are illustrated in the accompanying drawings and will be mainly described in the specification. However, the scope of the embodiments of the invention is not limited to the specific embodiments and should be construed as including all the changes, equivalents, and substitutions included in the spirit and scope of the invention.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When it is determined that a detailed description may make the purpose of the invention unnecessarily ambiguous in the description of the invention, such a detailed description will be omitted. In addition, the same components and corresponding components are given the same reference numeral.

Figure 1:
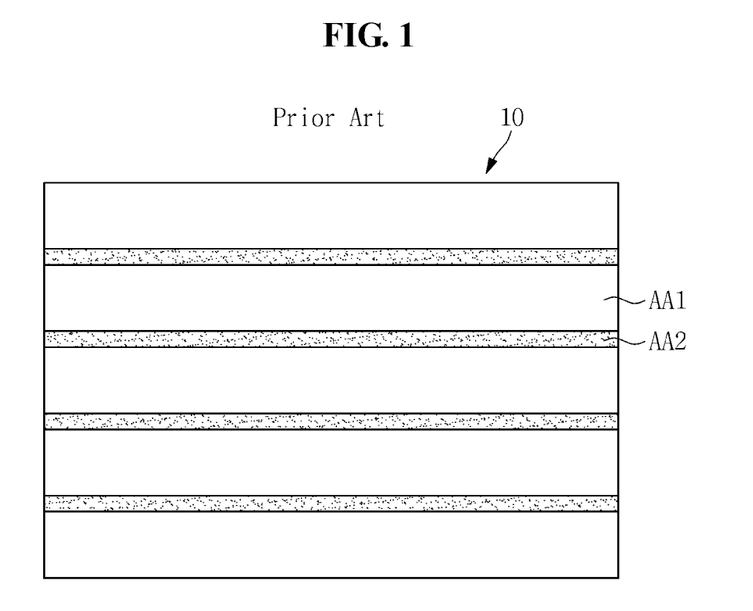
FIG. 1 is a plan view illustrating a waterfall phenomenon of a conventional display device.

FIG. 1 is a plan view illustrating a waterfall phenomenon of a conventional display device 10.

Referring to FIG. 1, the waterfall phenomenon refers to a case observed in the display device 10 in which a bright band-shaped portion AA1 and a dark band-shaped portion AA2 appear to flow down from the top to the bottom of the display device 10. The waterfall phenomenon is caused by various factors, one of which includes a protrusion of a semiconductor pattern reacting to light of a backlight unit.

In a case in which a semiconductor pattern and a data wiring pattern are provided using a single, common mask, the data wiring pattern is provided to have a smaller width than that of the semiconductor pattern in a plan view due to isotropy of wet etching and an etch-back process. In other words, the semiconductor pattern has a protrusion which does not overlap the data wiring pattern in a plan view.

The semiconductor pattern is generally including amorphous silicon (a-Si), and amorphous silicon varies in conductivity based on an amount of incident light. Accordingly, a capacitance of a capacitor provided between the semiconductor pattern and the data wiring pattern is affected by whether the protrusion of the semiconductor pattern receives light emitted from the backlight unit. As a result, the waterfall phenomenon may occur in the display device 10 in which the bright band-shaped portion AA1 and the dark band-shaped portion AA2 appear to flow down from the top to the bottom of the display device 10.

The disclosure has been made in view of the foregoing circumstances, and one of illustrative objects of exemplary embodiments thereof is to provide a display device enhanced in regard to display quality by preventing the waterfall phenomenon.

Hereinafter, exemplary embodiments of a display device according to the invention will be explained with respect to a liquid crystal display ("LCD") device, for example. However, the display device is not limited thereto, and features of the invention may also be applied to various other types of display devices such as an organic light emitting diode ("OLED") display device or a plasma display panel ("PDP") device.

Figure 2:
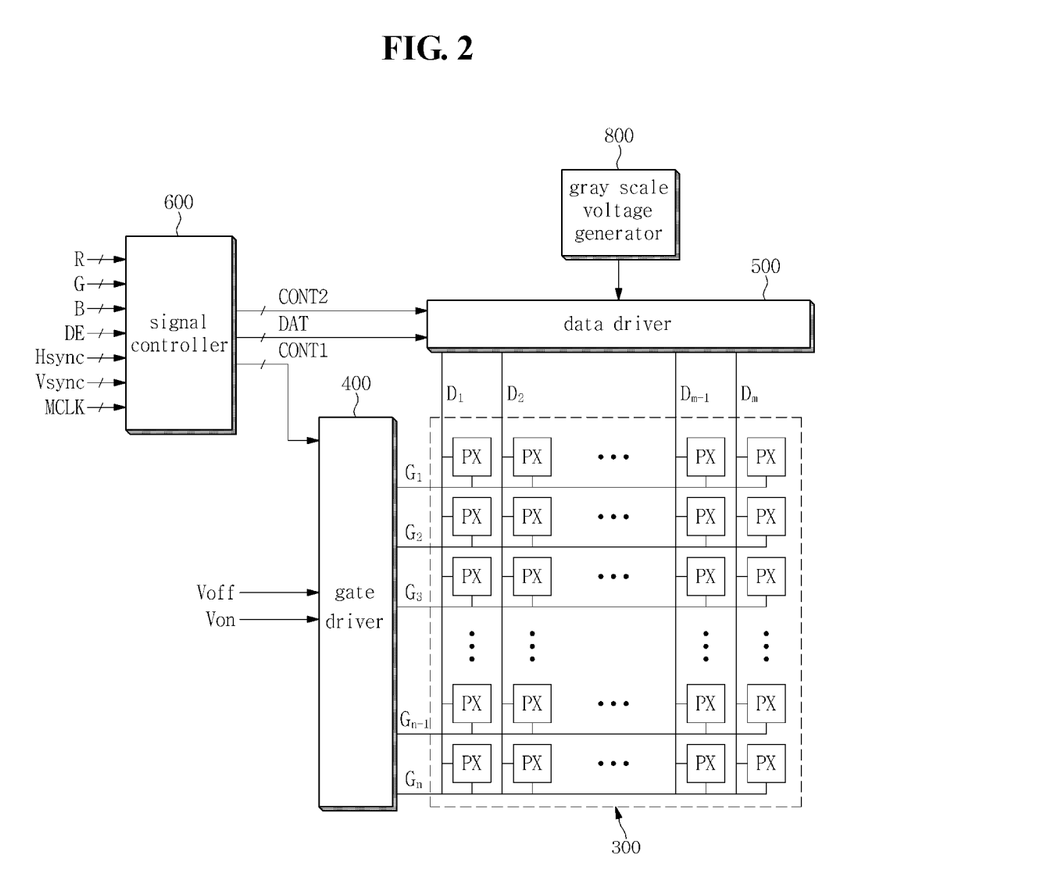
FIG. 2 is a block diagram illustrating an exemplary embodiment of a display device according to the invention.
Figure 3:
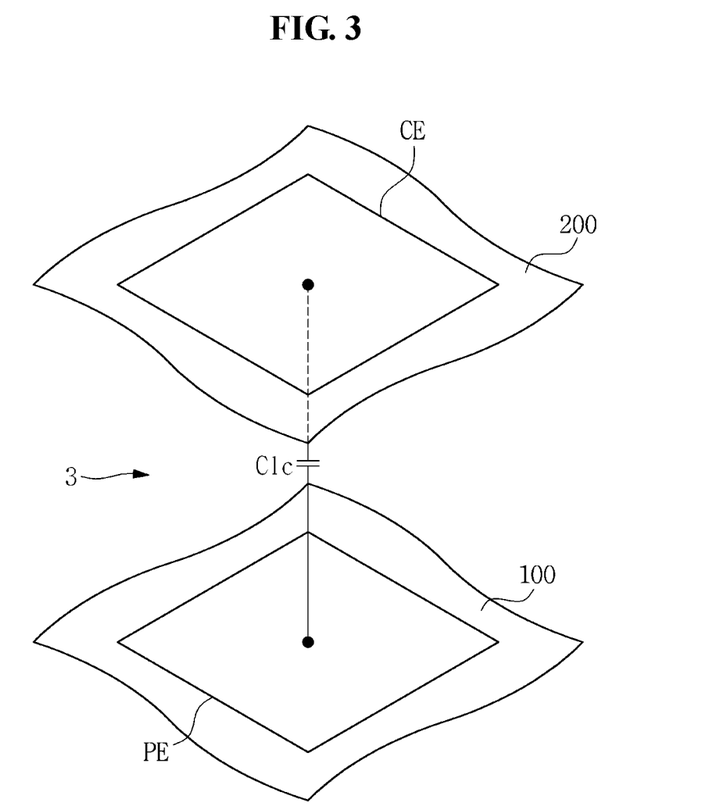
FIG. 3 is a schematic view illustrating a structure of one of a plurality of pixels illustrated in FIG. 2.

A display device according to an exemplary embodiment will be described hereinbelow with reference to FIGS. 2 and 3. FIG. 2 is a block diagram illustrating the display device according to the exemplary embodiment. FIG. 3 is a schematic view illustrating a structure of one of a plurality of pixels PX illustrated in FIG. 2.

Referring to FIG. 2, the display device according to the exemplary embodiment may include a display panel 300, a gate driver 400, a data driver 500, a signal controller 600, and a gray scale voltage generator 800.

The signal controller 600 may receive control signals input from a host, the control signals including such as image signals R, G and B, and a data enable signal DE, horizontal and vertical synchronization signals Hsync and Vsync, and a clock signal MCLK.

The signal controller 600 may output data control signals CONT2 and an image data signal DAT to the data driver 500, and may output gate control signals CONT1 for selecting gate lines to the gate driver 400. The signal controller 600 may output light control signals to a light source generator (not illustrated) in order to adjust a light source.

The gray scale voltage generator 800 may generate all or a limited number of gray scale voltages (hereinafter, also referred to as "reference gray scale voltage") provided to a pixel PX, and may output the generated gray scale voltage to the data driver 500. In an exemplary embodiment, the reference gray scale voltage may have a polarity different from a polarity of a common voltage.

The data driver 500 may receive an input of the reference gray scale voltage from the gray scale voltage generator 800, and may output gray scale voltages to a plurality of data lines D1-Dm in response to the control signals CONT2 and the image data signals DAT from the signal controller 600. In a case in which the gray scale voltage generator 800 provides a limited number of reference gray scale voltages, the data driver 500 may generate a greater number of expanded gray scale voltages than the number of reference gray scale voltages received by dividing the reference gray scale voltages.

When the data driver 500 provides the expanded gray scale voltages to the data lines D1-Dm, the data driver 500 may alternately apply voltages having different polarities to respective pixels for each frame while a magnitude difference between the gray scale voltages and the common voltage is maintained throughout.

The gate driver 400 may sequentially output gate signals to a plurality of gate lines G1-Gn in response to the gate control signal CONT1. The gate signal may have a gate-on voltage Von which turns on thin film transistors ("TFTs") connected to selected gate lines, and a gate-off voltage Voff which turns off TFTs connected to unselected gate lines.

FIG. 3 is a schematic view illustrating a structure of one of a plurality of pixels PX illustrated in FIG. 2.

Referring to FIGS. 2 and 3, the display panel 300 may include a first substrate 100, a second substrate 200 opposing the first substrate 100, and a liquid crystal ("LC") layer 3 between the first substrate 100 and the second substrate 200.

The first substrate 100 may include pixels PX arranged in rows and columns of a matrix form, a plurality of gate lines G1-Gn to each of which pixels PX in the same row are connected, and a plurality of data lines D1-Dm to each of which pixels PX in the same column are connected.

A pixel electrode PE may be disposed on the first substrate 100, and a common electrode CE may be disposed on the second substrate 200. The pixel electrode PE, the common electrode CE, and the LC layer 3 may form an LC capacitor Clc.

In an exemplary embodiment, the common electrode CE may be disposed on the second substrate 200, and may receive a common voltage. However, the exemplary embodiment is not limited thereto, and the common electrode CE may be disposed on the first substrate 100 and may have a linear shape or a bar shape based on the shape of the pixel electrode PE.

In an exemplary embodiment, the LC layer 3 may be filled in a sealant (not illustrated) between the first substrate 100 and the second substrate 200. In an exemplary embodiment, the LC layer 3 may function as a dielectric body. The sealant (not illustrated) may be disposed on one of the first substrate 100 and the second substrate 200, and may be configured to couple the first substrate 100 and the second substrate 200.

In an exemplary embodiment, the first substrate 100 and the second substrate 200 may maintain a cell gap therebetween in a range of about 2.0 micrometers (μm) to about 5.0

μm by the sealant (not illustrated) or a spacer (not illustrated), more particularly, in a range of about 3.3 μm to about 3.7 μm, for example.

Polarizers (not illustrated) may be disposed on the first substrate 100 and the second substrate 200, respectively, such that polarizing axes of the polarizers are substantially perpendicular to each other. In other words, the polarizers may be disposed on or below the first substrate 100 and on or below the second substrate 200, respectively.

Driving elements, for example, the gate driver 400, the data driver 500, the signal controller 600, and the gray scale voltage generator 800, may be connected to the display panel 300, whereby a display device is manufactured. In detail, the driving elements, for example, the gate driver 400, the data driver 500, the signal controller 600, and the gray scale voltage generator 800, may be disposed on an integrated circuit ("IC") chip and mounted directly on the display panel 300, may be mounted on a flexible printed circuit film (not illustrated) and attached to the display panel 300 in a form of a tape carrier package ("TCP"), or may be mounted on an additional printed circuit board ("PCB", not illustrated) and connected to the display panel 300.

Figure 4:
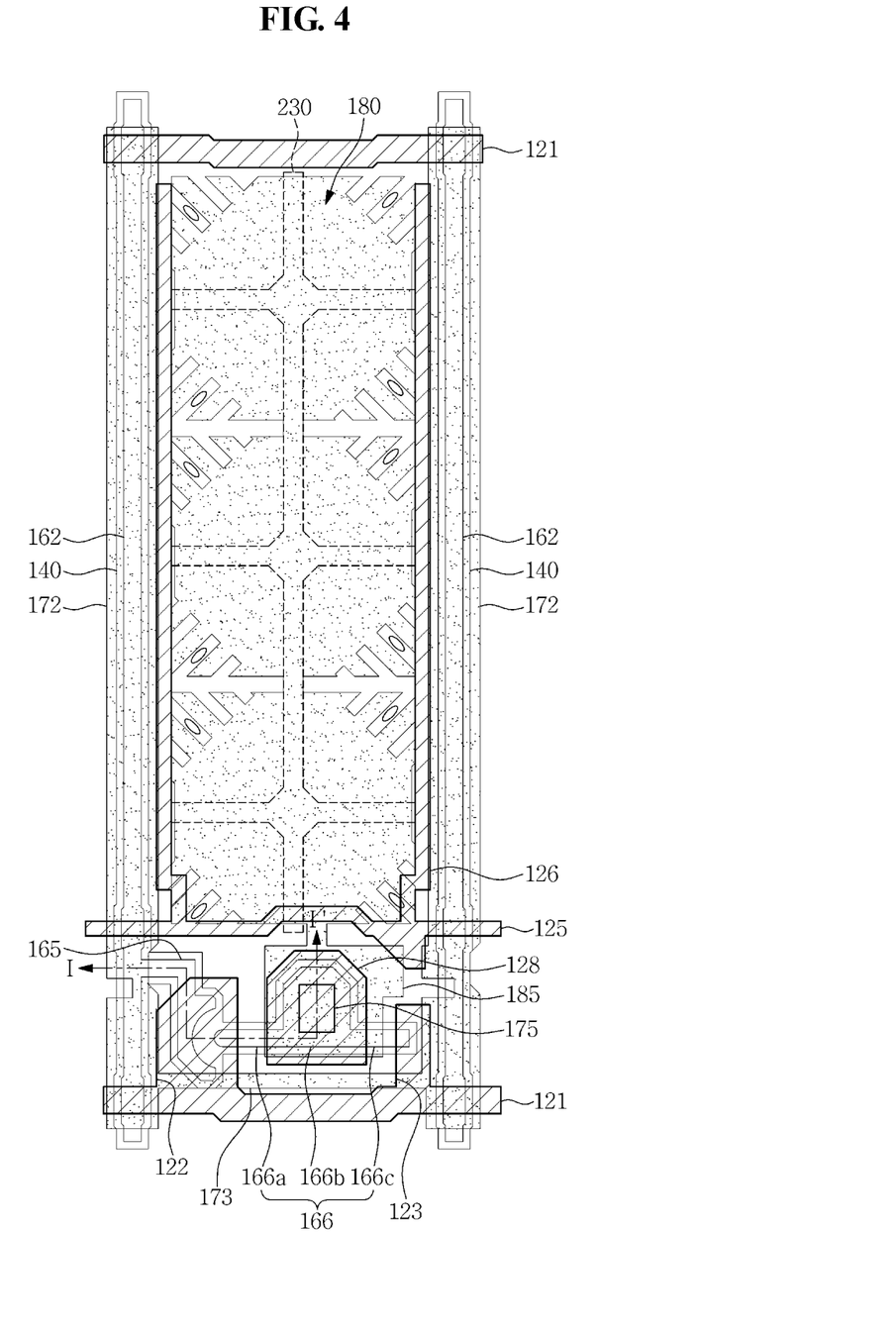
FIG. 4 is a plan view illustrating an exemplary embodiment of a pixel of a display panel according to the invention.
Figure 5:
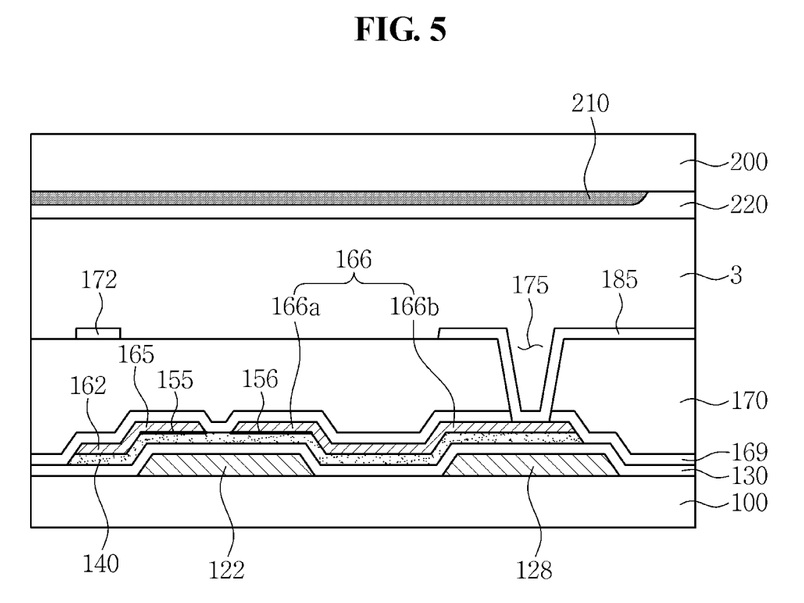
FIG. 5 is a cross-sectional view taken along line I-I' of FIG. 4.
Figure 6:
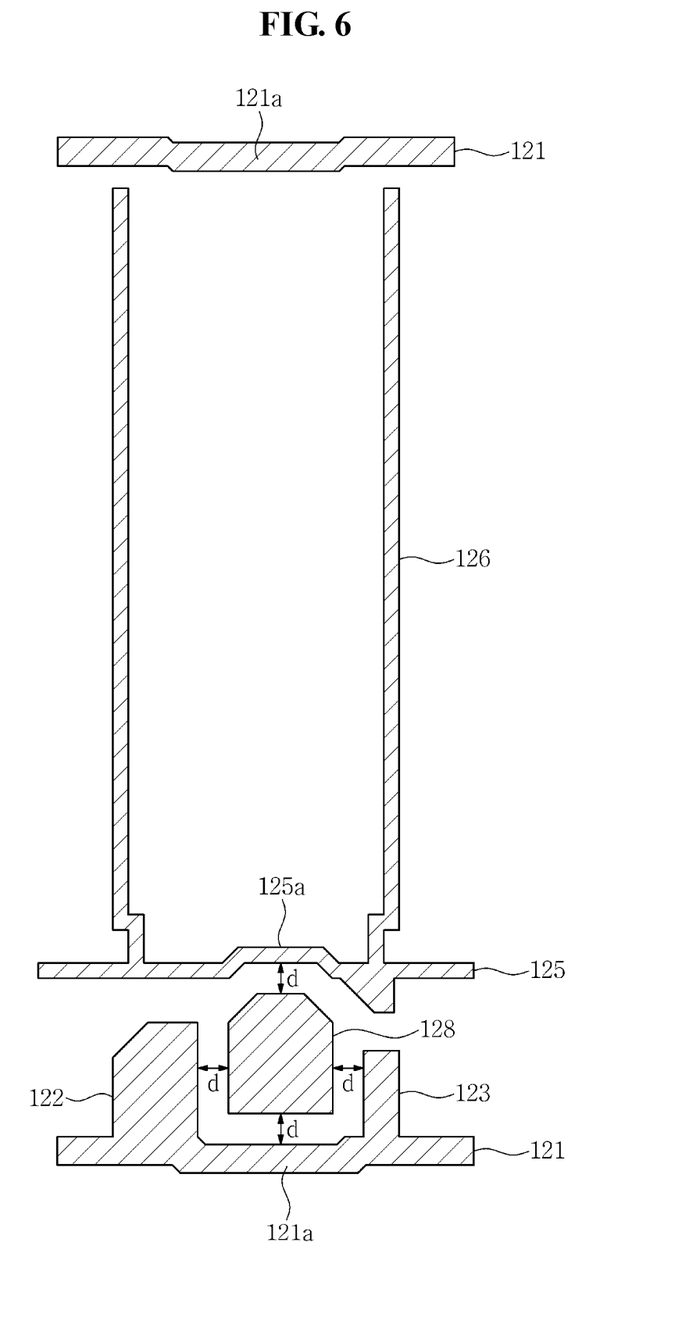
FIG. 6 is a plan view illustrating a gate layer conductor of FIG. 4.
Figure 7:
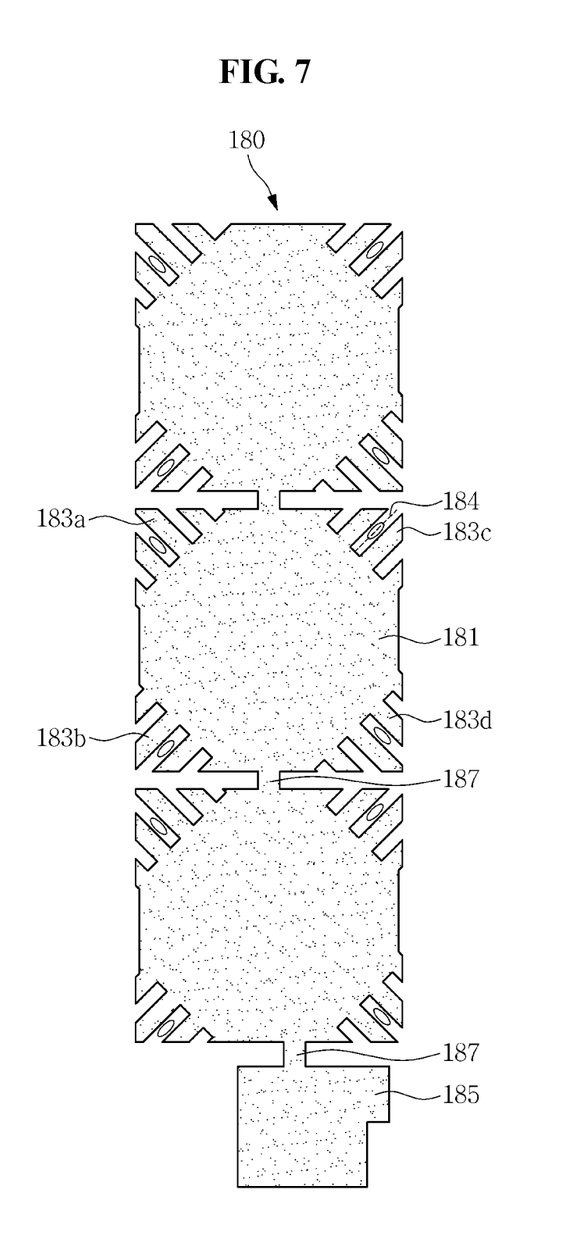
FIG. 7 is a plan view illustrating a pixel electrode of FIG. 4.
Figure 8:
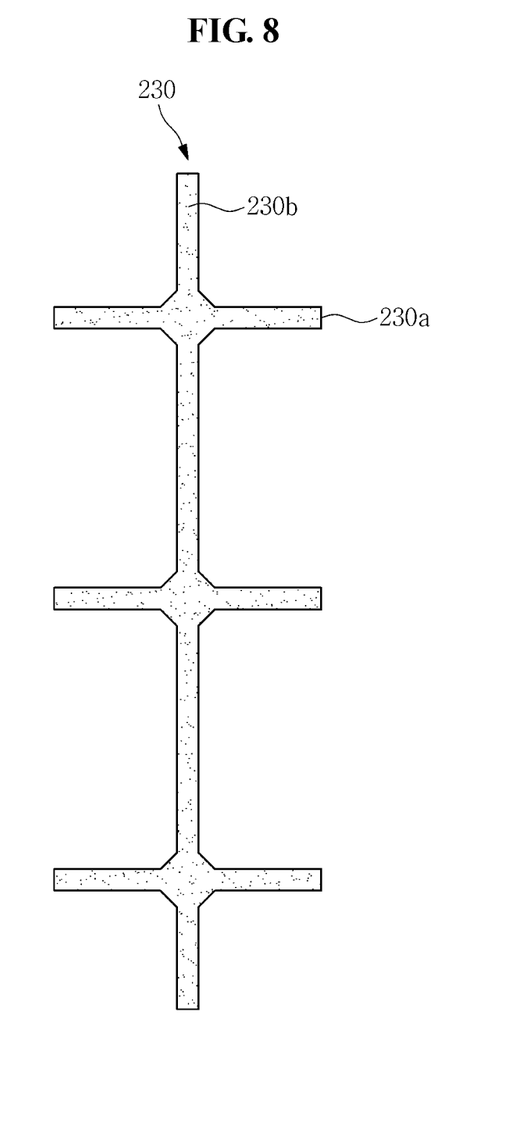
FIG. 8 is a plan view illustrating a common electrode of FIG. 4.

FIG. 4 is a plan view illustrating a pixel of the display panel according to the exemplary embodiment. FIG. 5 is a cross-sectional view taken along line I-I' of FIG. 4. FIG. 6 is a plan view illustrating a gate layer conductor of FIG. 4. FIG. 7 is a plan view illustrating a pixel electrode 180 of FIG. 4. FIG. 8 is a plan view illustrating a common electrode 230 of FIG. 4.

Referring to FIGS. 4 through 8, the first substrate 100 may be an insulating substrate including plastic, transparent glass such as soda lime glass or borosilicate glass, or the like, for example.

Gate layer conductors including gate wirings 121, 122, and 123 that transmit a gate signal, storage line wirings 125 and 126, and a backlight shielding electrode 128 may be disposed on the first substrate 100.

In an exemplary embodiment, the gate layer conductors, for example, the gate wirings 121, 122, and 123, the storage line wirings 125 and 126, and the backlight shielding electrode 128, (hereinafter, also referred to as "gate layer conductors 121, 122, 123, 125, 126, and 128") may include at least one of an aluminum (Al) based metal such as Al or an Al alloy, a silver (Ag) based metal such as Ag or an Ag alloy, a copper (Cu) based metal such as Cu or an Cu alloy, a molybdenum (Mo) based metal such as Mo or a Mo alloy, chromium (Cr), titanium (Ti), and tantalum (Ta), for example.

In an exemplary embodiment, the gate layer conductors 121, 122, 123, 125, 126, and 128 may have a multilayer structure including at least two conductive layers (not illustrated) having different physical properties, for example. In an exemplary embodiment, one of the two conductive layers may include a metal having low resistivity, for example, an Al-based metal, an Ag-based metal or a Cu-based metal, so as to reduce a signal delay or a voltage drop. In the exemplary embodiment, the other of the two conductive layers may include a material, for example, a Mo-based metal, Cr, Ti or Ta, which has an excellent contact property with respect to transparent conductive oxide ("TCO") such as indium-tin oxide ("ITO") and indium-zinc oxide ("IZO").

Examples of such a multilayer structure of the gate layer conductor may include a structure including a Cr lower layer and an Al upper layer, a structure including an Al lower layer and a Mo upper layer, and a structure including a Ti lower layer and a Cu upper layer. However, the exemplary embodiment is not limited thereto, and the gate layer conductors 121, 122, 123, 125, 126, and 128 may include various other metals and conductive materials.

The gate wirings 121, 122, and 123 may include a gate line 121 extending in a first direction, for example, a transverse direction, a gate electrode 122 protruding from the gate line 121 to have a protrusion shape, and a gate compensation portion 123 protruding from the gate line 121 to have a protrusion shape and spaced apart from the gate electrode 122 at a predetermined distance.

The gate line 121 may include a curved area 121a curved to have a predetermined shape so as to maintain a predetermined distance "d" between the gate line 121 and the backlight shielding electrode 128.

The gate electrode 122, along with a source electrode 165 and a drain electrode 166, may constitute a three-terminal of a TFT.

The gate compensation portion 123 may prevent the degradation of image quality caused by varying capacitance between the gate electrode 122 and the drain electrode 166 for each pixel due to a mask misalignment, and the like.

The storage line wirings 125 and 126 may include a horizontal portion 125 extending in a first direction, for example, a transverse direction, and a vertical portion 126 protruding from the horizontal portion 125 to extend therefrom in a second direction, for example, a longitudinal direction perpendicular to the first direction.

The storage line wirings 125 and 126 may extend along at least a side of the pixel electrode 180. The storage line wirings 125 and 126 may or may not overlap the pixel electrode 180.

In a case in which the storage line wirings 125 and 126 overlap the pixel electrode 180, the storage line wirings 125 and 126 may each overlap an edge of the pixel electrode 180 in order to prevent a decrease in an aperture ratio. The storage line wirings 125 and 126 may externally receive a storage voltage. In an exemplary embodiment, the storage voltage may be a direct current ("DC") voltage.

The horizontal portion 125 of the storage line wirings 125 and 126 may include a curved area 125a having a predetermined curved shape so as to maintain a predetermined distance "d" between the horizontal portion 125 and the backlight shielding electrode 128.

In other words, the gate wirings 121, 122 and 123, and the storage line wirings 125 and 126 may each be spaced apart from the backlight shielding electrode 128 at a predetermined distance "d". Thus, formation of a fringe field may be prevented, such that the degradation of image quality is prevented.

The backlight shielding electrode 128 may be disposed below a contact hole 175 through which the TFT and the pixel electrode 180 are connected.

A position of the backlight shielding electrode 128 may vary based on the shape of the TFT and the pixel electrode 180. In addition, in a case in which the pixel electrode 180 includes a plurality of sub-pixel electrodes to which different voltages are applied, the backlight shielding electrode 128 may include a plurality of backlight shielding electrodes.

The backlight shielding electrode 128 may not be provided with any control signal, and may not be connected to any conductors, for example, a gate wiring, a data wiring, a storage line wiring, and a pixel electrode. In other words, the backlight shielding electrode 128 may have an electrically floating island shape.

In an exemplary embodiment, the backlight shielding electrode 128 may have a circular or polygonal shape, for example, similarly to a second drain electrode 166b or a pixel electrode contact portion 185, and in order to enhance an aperture ratio, may have a hexagonal shape as illustrated in FIG. 6.

The backlight shielding electrode 128 may have a greater area than an overlapping area between the second drain electrode 166*b* and the pixel electrode contact portion 185.

The backlight shielding electrode 128 may prevent the pixel electrode 180 from being affected by light emitted from a backlight unit (not illustrated) being irradiated to a protrusion of a semiconductor layer.

The gate wirings 121, 122 and 123, the storage line wirings 125 and 126, and the backlight shielding electrode 128 may be simultaneously provided in the same process.

A gate insulating layer 130 may be disposed on the first substrate 100 on which the gate layer conductors 121, 122, 123, 125, 126, and 128 are provided. In an exemplary embodiment, the gate insulating layer 130 may include silicon oxide ($SiO_x$) or silicon nitride ($SiN_x$), for example. In an exemplary embodiment, the gate insulating layer 130 may further include aluminum oxide, titanium oxide, tantalum oxide, or zirconium oxide, for example.

A semiconductor layer 140 may be disposed on the gate insulating layer 130. The semiconductor layer 140 may substantially overlap data wirings 162, 165 and 166, which are to be described further below. In an exemplary embodiment, the semiconductor layer 140 may include an oxide semiconductor including at least one of amorphous silicon (a-Si), polycrystalline silicon (poly-Si), gallium (Ga), indium (In), tin (Sn), and zinc (Zn), for example.

Ohmic contact layers 155 and 156 may be disposed on the semiconductor layer 140. The ohmic contact layers 155 and 156 may serve to enhance a contact property between the source electrode 165 and the drain electrode 166, which are to be described further below, and the semiconductor layer 140. The ohmic contact layers 155 and 156 may not be disposed in a channel region between the source electrode 165 and the drain electrode 166.

In this instance, the ohmic contact layers 155 and 156 may include amorphous silicon doped with high-concentration n-type impurities (n+a-Si), for example. In a case in which a contact property between the semiconductor layer 140, and the source electrode 165 and the drain electrode 166 is sufficiently secured, the ohmic contact layers 155 and 156 may be omitted.

The data wirings 162, 165 and 166 may be disposed on the semiconductor layer 140. The data wirings 162, 165 and 166 may include the same material included in the aforementioned gate layer conductors 121, 122, 123, 125, 126, and 128.

The data wirings 162, 165 and 166 may include a data line 162, the source electrode 165, and the drain electrode 166. The data line 162 may be provided in a second direction, for example, a longitudinal direction, intersecting the gate line 121 so as to define, along with the gate line 121, a pixel region.

The source electrode 165 may be branched from the data line 162 to extend on to the gate electrode 122.

The drain electrode 166 may include a first drain electrode 166*a* having a portion overlapping the gate electrode 122, a second drain electrode 166*b* extending from the first drain electrode 166*a* to have a polygonal shape, and a third drain electrode 166*c* extending from the second drain electrode 166*b* to overlap the gate compensation portion 123. However, the exemplary embodiment is not limited thereto, and the second drain electrode 166*b* may be modified into various shapes, such as a circular or quadrangular shape, based on the disposition of the TFT and the pixel electrode 180.

During operation of the TFT, a channel through which charge is transmitted may be provided within the semiconductor layer 140 between the source electrode 165 and the drain electrode 166.

In a case in which the semiconductor layer 140 and the data wirings 162, 165 and 166 are provided using the same mask, the data wirings 162, 165 and 166 may have substantially the same pattern, except the channel region, as that of the semiconductor layer 140, which is provided below the data wirings 162, 165 and 166.

However, based on an etching scheme using the same mask, the semiconductor layer 140 may have protrusions protruding therefrom further than both side walls of each of the data wirings 162, 165, and 166 to a predetermined distance of about 3 μm or less, for example, so as to be uncovered by the data wirings 162, 165 and 166.

A passivation layer 169 may be disposed over the entirety of a structure obtained as a result of forming the data wirings 162, 165, and 166. In an exemplary embodiment, the passivation layer 169 may have a monolayer or multilayer structure including, for example, silicon oxide ($SiO_x$), silicon nitride ($SiN_x$), an organic material having photosensitivity, a low-dielectric-constant insulating material such as a-Si:C:O or a-Si:O:F, or the like.

A color filter 170 may be disposed on the passivation layer 169. In an exemplary embodiment, the color filter 170 may be disposed only on the pixel region, or alternatively, may be disposed on the pixel region and an area in which the TFT is provided.

In an exemplary embodiment, the color filter 170 may display one of red, green, blue, cyan, magenta, yellow, and white colors, for example. Three basic colors including a combination of red, green and blue colors, or a combination of cyan, magenta and yellow colors may be provided as a basic pixel group for forming a color. However, the exemplary embodiment is not limited thereto, and the color filter 170 may be disposed on the second substrate 200.

Although not illustrated, a capping layer may further be disposed on the color filter 170. The capping layer (not illustrated) may serve to prevent contaminants generated from the color filter 170 from flowing into the LC layer 3. In an exemplary embodiment, the capping layer may include an inorganic material such as silicon nitride ($SiN_x$), silicon oxide ($SiO_x$), or silicon oxycarbide (SiOC), or an organic material, for example.

The contact hole 175 through which a portion of the second drain electrode 166*b* is exposed may be defined in the passivation layer 169 and the color filter 170.

An ambient light shielding electrode 172 may be disposed on the color filter 170, along the data line 162. The ambient light shielding electrode 172 may have a width wider than that of the data line 162, and in a plan view, may be disposed to cover the data line 162.

In addition, a protruding electrode 173 may be disposed on the color filter 170 to be parallel to the gate line 121. The protruding electrode 173 may be integrally provided with the ambient light shielding electrode 172. The ambient light shielding electrode 172 and the protruding electrode 173 may receive a voltage corresponding to a black gray scale. In an exemplary embodiment, the ambient light shielding electrode 172 and the protruding electrode 173 may include a transparent conductor such as ITO or IZO. The ambient light shielding electrode 172 and the protruding electrode 173 may be simultaneously provided with the pixel electrode 180 in the same process, and may be electrically insulated through an additional insulating layer.

The pixel electrode 180 may be disposed in the pixel region on the color filter 170. In an exemplary embodiment, the pixel electrode 180 may include a transparent conductor such as ITO or IZO.

The pixel electrode 180, as illustrated in FIGS. 4 and 7, may include a plurality of planar electrodes 181 arranged in a second direction, branch electrodes 183*a*, 183*b*, 183*c*, and 183*d* extending from each of the planar electrodes 181, the pixel electrode contact portion 185 connected to the second drain electrode 166*b* through the contact hole 175, and a connector 187 connecting adjacent planar electrode 181 and connecting the planar electrode 181 and the pixel electrode contact portion 185.

In an exemplary embodiment, the planar electrode 181 may have a lozenge shape, for example. The branch electrodes 183*a*, 183*b*, 183*c*, and 183*d* may each extend from a side of the planar electrode 181 in an oblique direction. In this instance, the branch electrodes 183*a*, 183*b*, 183*c*, and 183*d* may each extend from a side of the planar electrode 181 in a direction perpendicular to the corresponding side thereof.

A space between the branch electrodes 183*a*, 183*b*, 183*c*, and 183*d* may be defined as a slit, and a direction of a major axis 184 of an LC may be determined by the slit. In other words, the major axis 184 of the LC may correspond to a length direction of the slit.

In an exemplary embodiment, the pixel electrode contact portion 185 may have a polygonal shape, for example, similarly to the backlight shielding electrode 128 or the second drain electrode 166*b*. However, the shape of the pixel electrode contact portion 185 is not limited thereto, and the pixel electrode contact portion 185 may have various shapes such as a circular shape, for example.

Although not illustrated, a lower alignment layer may be disposed on the pixel electrode 180. In an exemplary embodiment, the lower alignment layer may be a homeotropic alignment layer, and may include a photosensitive material, for example.

In an exemplary embodiment, the lower alignment layer may include one or more of the followings: polyamic acid, polysiloxane, and polyimide, for example.

In an exemplary embodiment, the second substrate 200 may be an insulating substrate including plastic, transparent glass such as soda lime glass or borosilicate glass, or the like.

A light shielding member 210 may be disposed on the second substrate 200. In an exemplary embodiment, the light shielding member 210 may also be referred to as a black matrix, and may include a metal such as chromium oxide (CrO$_x$) or an opaque organic layer forming material.

The light shielding member 210 may have a plurality of apertures having a shape similar to that of the pixel PX, such that light emitted from the backlight unit (not illustrated) may be transmitted through the pixel PX. In addition, the light shielding member 210 may be disposed in areas corresponding to the gate line 122, the data line 162, and the TFT which are disposed on the first substrate 100. However, the exemplary embodiment is not limited thereto, and the light shielding member 210 may be disposed on the first substrate 100.

An overcoat layer 220 may be disposed on the light shielding member 210. The overcoat layer 220 may serve to planarize a curved surface of a layer below the overcoat layer 220, such as the light shielding member 210, or to prevent the eruption of impure elements from such a layer therebelow. However, the exemplary embodiment is not limited thereto, and in the case that the light shielding member 210 is disposed on the first substrate 100, the overcoat layer 220 may be disposed on the light shielding member 210 of the first substrate 100.

The common electrode 230 may be disposed on the overcoat layer 220.

The common electrode 230, as illustrated in FIGS. 4 and 8, may have a cross shape including a horizontal electrode 230*a* and a vertical electrode 230*b* intersecting each other. An intersecting portion between the horizontal electrode 230*a* and the vertical electrode 230*b* may be positioned at a center portion of the planar electrode 181.

Since the pixel PX may include a plurality of common electrodes 230, the plurality of common electrodes 230 may be connected to one another. In an exemplary embodiment, the plurality of common electrodes 230 may be unitary. The common electrode 230 may include the same material included in the pixel electrode 180.

Although not illustrated, an alignment layer may further be disposed on the common electrode 230. In an exemplary embodiment, the alignment layer may be a homeotropic alignment layer or an alignment layer which is photo-aligned using a photo-polymerization material, for example. In an exemplary embodiment, such a photo-polymerization material may be a reactive monomer or a reactive mesogen, for example.

Figure 9:
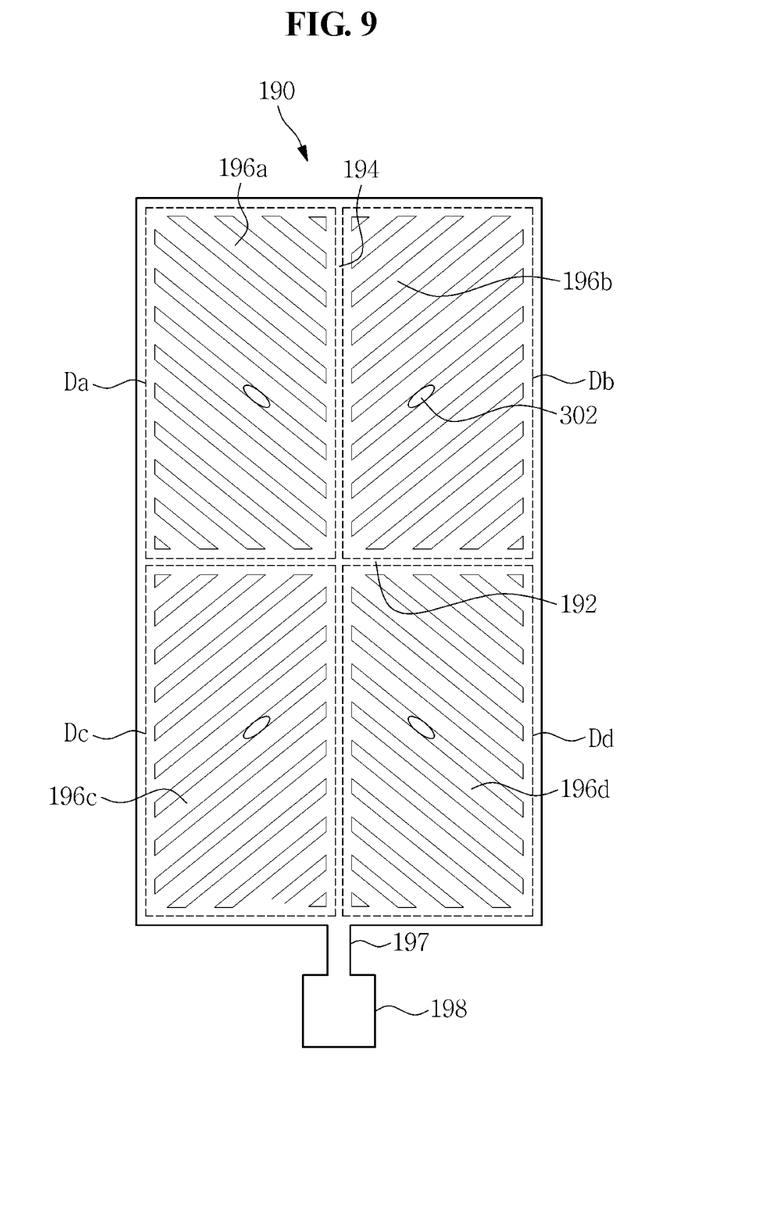
FIG. 9 is a plan view illustrating another exemplary embodiment of a pixel of a display panel according to the invention.

FIG. 9 is a plan view illustrating a structure of a pixel electrode 190 according to another exemplary embodiment.

Referring to FIG. 9, the pixel electrode 190 may include a transverse stem electrode 192, a longitudinal stem electrode 194, a plurality of branch electrodes 196*a*, 196*b*, 196*c*, and 196*d* branched from the transverse stem electrode 192 and the longitudinal stem electrode 194, a connector 197, and a pixel electrode contact portion 198.

The transverse stem electrode 192 and the longitudinal stem electrode 194 may have a linear shape, and the transverse stem electrode 192 and the longitudinal stem electrode 194 may be combined with each other to form a cross-shaped stem electrode. However, the shape of the transverse stem electrode 192 and the longitudinal stem electrode 194 is not limited thereto, and the transverse stem electrode 192 and the longitudinal stem electrode 194 may each have a shape in which a width thereof increases from an end to a center portion thereof.

A first branch electrode 196*a* may be branched from the transverse stem electrode 192 and the longitudinal stem electrode 194 to extend therefrom in an upper-left direction. A second branch electrode 196*b* may be branched from the transverse stem electrode 192 and the longitudinal stem electrode 194 to extend therefrom in an upper-right direction. A third branch electrode 196*c* may be branched from the transverse stem electrode 192 and the longitudinal stem electrode 194 to extend therefrom in a lower-left direction. A fourth branch electrode 196*d* may be branched from the transverse stem electrode 192 and the longitudinal stem electrode 194 to extend therefrom in a lower-right direction.

Sides of the first, second, third, and fourth branch electrodes 196*a*, 196*b*, 196*c*, and 196*d* may distort an electric field to form a horizontal component of the electric field which determines an inclination direction of an LC molecule 302. The horizontal component of the electric field may be provided substantially parallel to the sides of the first, second, third, and fourth branch electrodes 196*a*, 196*b*, 196*c*, and 196*d*. Accordingly, the LC molecules 302 may be arranged in four different directions in four sub-areas Da, Db, Dc, and Dd of the pixel electrode 190, respectively.

The connector 197 may connect the longitudinal stem electrode 194 and the pixel electrode contact portion 198.

Referring to FIGS. 4 and 9, the pixel electrode contact portion 198 may contact the second drain electrode 166b through the contact hole 175 provided in the passivation layer 169 and the color filter 170.

In an exemplary embodiment, the pixel electrode contact portion 198 may have a polygonal shape, for example, similarly to the backlight shielding electrode 128 or the second drain 166b. However, the shape of the pixel electrode contact portion 198 is not limited thereto, and the pixel electrode contact portion 198 may have various other shapes such as a circular shape or a polygonal shape.

In this instance, the common electrode 230 may have a continuous planar electrode shape in which a plurality of slits (cut-out portions) is not defined, for example.

As set forth above, according to one or more exemplary embodiments, the display device may prevent a waterfall phenomenon by disposing the backlight shielding electrode, having an island shape, below the contact hole connecting the TFT and the pixel electrode.

From the foregoing, it will be appreciated that various embodiments in accordance with the disclosure have been described herein for purposes of illustration, and that various modifications may be made without departing from the scope and spirit of the teachings. Accordingly, the various embodiments disclosed herein are not intended to be limiting of the true scope and spirit of the teachings. Various features of the above described and other embodiments can be mixed and matched in any manner, to produce further embodiments consistent with the invention.

What is claimed is:

1. A display device comprising:
a substrate;
a gate wiring on the substrate, the gate wiring comprising a gate line and a gate electrode;
a storage line wiring on the substrate, the storage line wiring comprising a horizontal portion and a vertical portion;
a data wiring which is disposed on the substrate and insulated from the gate wiring, the data wiring comprising a data line, a source electrode, and a drain electrode;
a pixel electrode which is disposed on the substrate and insulated from the data wiring, the pixel electrode being connected to the drain electrode through a contact hole;
a backlight shielding electrode below the contact hole;
wherein a distance between the backlight shielding electrode and the gate line is substantially the same as a distance between the backlight shielding electrode and the horizontal portion.

2. The display device of claim 1, wherein the backlight shielding electrode and the gate wiring are disposed on a same layer.

3. The display device of claim 2, wherein the backlight shielding electrode is spaced apart from the gate wiring.

4. The display device of claim 1, wherein the backlight shielding electrode has an island shape.

5. The display device of claim 4, wherein the backlight shielding electrode has one of a circular shape and a polygonal shape.

6. The display device of claim 1, wherein the backlight shielding electrode has an area greater than an overlapping area between the drain electrode and the pixel electrode.

7. The display device of claim 1, wherein the drain electrode comprises:
a first drain electrode having a portion overlapping the gate electrode; and
a second drain electrode extending from the first drain electrode and having a polygonal shape.

8. The display device of claim 7, wherein the backlight shielding electrode has an area greater than an overlapping area between the second drain electrode and the pixel electrode.

9. The display device of claim 7, wherein the pixel electrode comprises a pixel electrode contact portion connected to the second drain electrode through the contact hole.

10. The display device of claim 1, further comprising a semiconductor layer which overlaps the data wiring.

11. The display device of claim 10, wherein the semiconductor layer directly contacts the data wiring.

12. A display device comprising:
a first substrate and a second substrate opposing each other;
a liquid crystal layer between the first substrate and the second substrate;
a gate wiring on the first substrate, the gate wiring comprising a gate line and a gate electrode;
a storage line wiring on the substrate, the storage line wiring comprising a horizontal portion and a vertical portion;
a data wiring which is disposed on the first substrate and insulated from the gate wiring, the data wiring comprising a data line, a source electrode, and a drain electrode;
a pixel electrode which is disposed on the first substrate and insulated from the data wiring, the pixel electrode being connected to the drain electrode through a contact hole;
a backlight shielding electrode below the contact hole;
wherein a distance between the backlight shielding electrode and the gate line is substantially the same as a distance between the backlight shielding electrode and the horizontal portion.

13. The display device of claim 12, wherein the backlight shielding electrode and the gate wiring are disposed on a same layer.

14. The display device of claim 13, wherein the backlight shielding electrode is spaced apart from the gate wiring.

15. The display device of claim 12, wherein the backlight shielding electrode has an island shape.

16. The display device of claim 15, wherein the backlight shielding electrode has one of a circular shape and a polygonal shape.

17. The display device of claim 12, wherein the backlight shielding electrode has an area greater than an overlapping area between the drain electrode and the pixel electrode.

18. The display device of claim 12, wherein the drain electrode comprises:
a first drain electrode having a portion overlapping the gate electrode; and
a second drain electrode extending from the first drain electrode and having a polygonal shape.

19. The display device of claim 18, wherein the backlight shielding electrode has an area greater than an overlapping area between the second drain electrode and the pixel electrode.

20. The display device of claim 12, wherein the pixel electrode comprises a transverse stem electrode, a longitudinal stem electrode, a plurality of branch electrodes extending from the transverse stem electrode and the longitudinal stem electrode, a connector extending from the longitudinal stem electrode, and a pixel electrode contact portion extending from the connector.

21. The display device of claim 20, wherein the plurality of branch electrodes comprises a first branch electrode extending from the transverse stem electrode and the longitudinal stem electrode in an upper-left direction, a second branch electrode extending from the transverse stem electrode and the longitudinal stem electrode in an upper-right direction, a third branch electrode extending from the transverse stem electrode and the longitudinal stem electrode in a lower-left direction, and a fourth branch electrode extending from the transverse stem electrode and the longitudinal stem electrode in a lower-right direction.

22. The display device of claim 12, further comprising a color filter between the data wiring and the pixel electrode.

* * * * *